(12) United States Patent
Onduka et al.

(10) Patent No.: US 12,283,614 B2
(45) Date of Patent: Apr. 22, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shinji Onduka, Nonoichi Ishikawa (JP); Akira Ezaki, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 18/409,785

(22) Filed: Jan. 10, 2024

(65) Prior Publication Data

US 2024/0145558 A1    May 2, 2024

Related U.S. Application Data

(62) Division of application No. 17/007,032, filed on Aug. 31, 2020, now abandoned.

(30) Foreign Application Priority Data

Mar. 18, 2020 (JP) .................... 2020-047277

(51) Int. Cl.
| | | |
|---|---|---|
| *H01L 29/417* | (2006.01) | |
| *H01L 21/268* | (2006.01) | |
| *H01L 21/304* | (2006.01) | |
| *H01L 21/3065* | (2006.01) | |
| *H01L 21/78* | (2006.01) | |

(Continued)

(52) U.S. Cl.
CPC ...... *H01L 29/41741* (2013.01); *H01L 21/268* (2013.01); *H01L 21/78* (2013.01); *H01L 29/401* (2013.01); *H01L 21/3043* (2013.01); *H01L 21/3065* (2013.01); *H01L 29/4975* (2013.01)

(58) Field of Classification Search
CPC .................. H01L 21/268; H01L 21/78–86
See application file for complete search history.

(56) References Cited

U.S. PATENT DOCUMENTS

| | | | |
|---|---|---|---|
| 2017/0263500 A1 | 9/2017 | Mizuno et al. | |
| 2017/0263524 A1* | 9/2017 | Mizuno ................. | H01L 21/311 |
| 2017/0263525 A1* | 9/2017 | Mizuno ................. | H01L 23/544 |

(Continued)

FOREIGN PATENT DOCUMENTS

| | | | |
|---|---|---|---|
| CN | 107180745 A | | 9/2017 |
| JP | 05166926 A | * | 7/1993 |

(Continued)

OTHER PUBLICATIONS

Otsuka (Year: 1991).*

*Primary Examiner* — Raj R Gupta
(74) *Attorney, Agent, or Firm* — Knobbe, Martens, Olson & Bear, LLP (57) ABSTRACT

Provided is a semiconductor device including: a substrate containing a semiconductor material; an electrode provided on a substrate surface of the substrate, the electrode containing a metal material; and a mixed member provided on the substrate surface to be in contact with the electrode, the mixed member containing the semiconductor material and the metal material, in which a portion of the substrate surface is exposed at an end of the substrate.

5 Claims, 6 Drawing Sheets

(51) Int. Cl.
 *H01L 29/40* (2006.01)
 *H01L 29/49* (2006.01)

(56) References Cited

U.S. PATENT DOCUMENTS

2020/0020585 A1* 1/2020 Wakahara ........... H01L 21/0206
2020/0058742 A1   2/2020 Nakata

FOREIGN PATENT DOCUMENTS

| JP | H05-166926 A | 7/1993 |
| JP | 2016-046321 A | 4/2016 |
| JP | 2017-163070 A | 9/2017 |
| JP | 6387855 B2 | 9/2018 |
| JP | 2020-021786 A | 2/2020 |
| WO | 2018/190271 A1 | 10/2018 |

\* cited by examiner

SEMICONDUCTOR DEVICE

CROSS-REFERENCE TO RELATED APPLICATION

This is a divisional application of application Ser. No. 17/007,032 filed Aug. 31, 2020, which is based upon and claims the benefit of priority from Japanese Patent Application No. 2020-047277, filed on Mar. 18, 2020, the entire contents of which are incorporated herein by reference.

FIELD

Embodiments described herein relate generally to semiconductor devices.

BACKGROUND

Semiconductor devices such as a metal oxide semiconductor field effect transistor (MOSFET) are used for applications of power conversion and the like. Such a semiconductor device has an electrode, for example, on one surface (back surface) of a substrate. Herein, in order to reduce on-resistance, it is preferable that the adhesion property between the electrode and the substrate is high.

DETAILED DESCRIPTION

Hereinafter, an embodiment will be described with reference to the drawings. In addition, in the following description, the same members and the like will be denoted by the same reference numerals, and the description of the members and the like once described will be appropriately omitted.

In this specification, in order to illustrate the positional relationship of parts and the like, the upward direction of the drawings is referred to as "upper", and the downward direction of the drawings is referred to as "lower". In this specification, the terms "upper" and "lower" do not necessarily indicate the relationship with the direction of gravity.

First Embodiment

A semiconductor device according to this embodiment includes: a substrate containing a semiconductor material; an electrode provided on a substrate surface of the substrate, the electrode containing a metal material; and a mixed member provided on the substrate surface to be in contact with the electrode, the mixed member containing the semiconductor material and the metal material, in which a portion of the substrate surface is exposed at an end of the substrate.

Figure 1A:
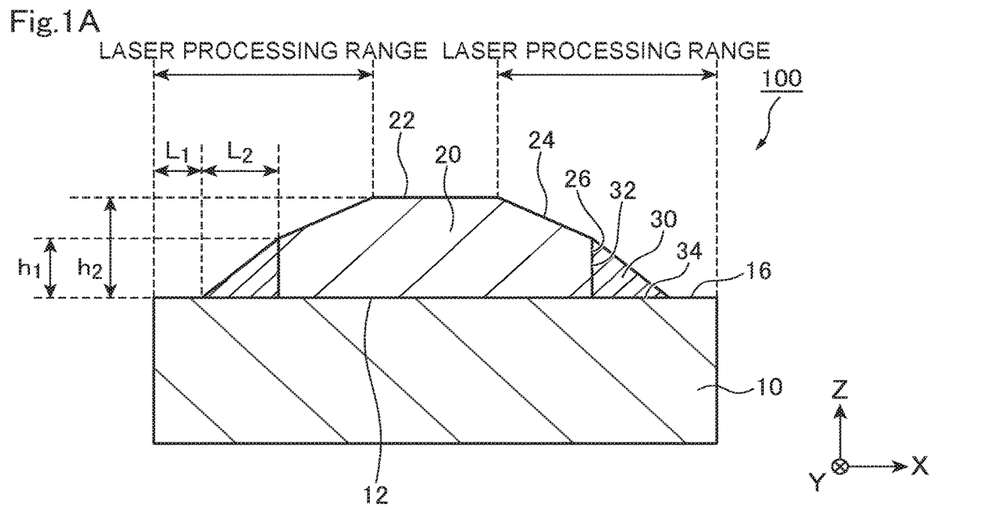
FIGS. 1A and 1B are schematic diagrams of a semiconductor device according to a first embodiment.
Figure 1B:
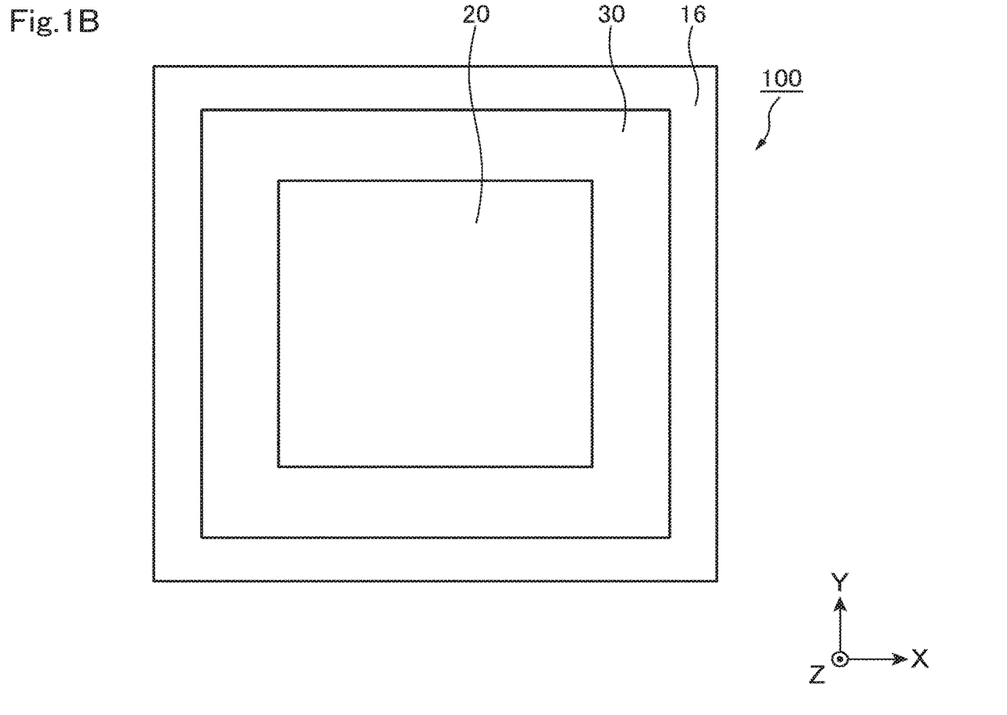

FIGS. 1A and 1B are schematic diagrams of a semiconductor device 100 according to this embodiment. The semiconductor device 100 according to this embodiment is, for example, a MOSFET. FIG. 1A is a schematic cross-sectional diagram of the semiconductor device 100 according to this embodiment in a plane perpendicular to a substrate surface 12. FIG. 1B is a schematic top diagram of the semiconductor device 100 according to this embodiment.

The semiconductor device 100 includes a substrate 10, an electrode 20, and a mixed member 30.

The substrate 10 contains a semiconductor material. Herein, the semiconductor material is, for example, silicon (Si), silicon carbide (SiC), gallium arsenide (GaAs), gallium nitride (GaN), or the like, but is not limited to silicon (Si), silicon carbide (SiC), gallium arsenide (GaAs), gallium nitride (GaN), or the like.

The electrode 20 is provided on the substrate surface 12 of the substrate 10 and is in contact with the substrate surface 12. The electrode 20 functions as, for example, a drain electrode of the MOSFET. The electrode 20 contains a metal material. Herein, the metal material is, for example, copper (Cu), aluminum (Al), nickel (Ni), silver (Ag), gold (Au), or the like, but is not limited to copper (Cu), aluminum (Al), nickel (Ni), silver (Ag), gold (Au), or the like.

A chamfered portion 24 is provided at an end of an upper surface 22 of the electrode 20 in a plane perpendicular to the substrate surface 12.

The mixed member 30 is provided on the substrate surface 12 in contact with a side surface 26 of the electrode. The mixed member 30 contains a semiconductor material included in the substrate 10 and a metal material included in the electrode 20. The mixed member 30 is provided around the electrode 20 as illustrated in FIG. 1B. In addition, at the end of the substrate 10, an exposed portion 16 of the substrate surface is provided around the mixed member 30. In other words, a portion of the substrate surface 12 around the mixed member 30 is exposed at the end of the substrate 10. The exposed portion 16 of the substrate surface, the mixed member 30, and the chamfered portion 24 are areas to be processed by a laser described later. In addition, in the exposed portion 16 of the substrate surface, a portion of the substrate 10 may be removed by the laser processing described later.

In a case where the substrate 10 is a Si substrate containing Si, for example, the mixed member 30 does not contain silicide. Herein, the phrase "does not contain silicide" also includes cases where it is considered that silicide is not contained in the mixed member 30 because silicide is contained in the mixed member 30 at the detection lower limit or less and therefore silicide is not detected by the analytical instrument. In addition, for example, by an electron diffraction (ED) method using a transmission electron microscope (TEM), it can be preferably detected whether or not the silicide is contained. In addition, even the mixed member 30 in which the silicide exceeds the lower limit of detection of the analytical instrument is preferably applicable to the semiconductor device 100.

In the plane perpendicular to the substrate surface 12, the mixed member 30 has a triangular shape having a side 32 in contact with the side surface 26 of the electrode and a side 34 in contact with the substrate surface 12. Herein, in FIG. 1A, the shape of the mixed member 30 is a right-angled triangle in which the side 32 in contact with the side surface 26 of the electrode and the side 34 in contact with the substrate surface 12 perpendicularly intersect. However, the shape of the mixed member 30 is not limited to the right-angled triangle, and another triangular shape may be used. In addition, the triangular shape of the mixed member 30 includes a triangular shape of which one side is not a straight line but a curved line. Furthermore, the triangular shape of the mixed member 30 may further include a convex portion or a concave portion. As described above, the shape of the mixed member 30 is not particularly limited.

A height $h_1$ of the mixed member 30 in the plane perpendicular to the substrate surface 12 is, for example, about 50 nm. A height $h_2$ of the electrode 20 in the plane perpendicular to the substrate surface 12 is, for example, about 1 μm. A length $L_1$ of the exposed portion 16 of the substrate in the direction parallel to the substrate surface 12 is, for example, about 10 μm. A length $L_2$ of the mixed member 30 in the direction parallel to the substrate surface 12 is, for example, about 500 nm.

FIGS. 2A to 2H are schematic cross-sectional diagrams illustrating the processes of manufacturing the semiconductor device according to this embodiment. In addition, the shape of the electrode 20 and the shape of the mixed member 30 do not match with those illustrated in FIGS. 1A and 1B.

Figure 2A:
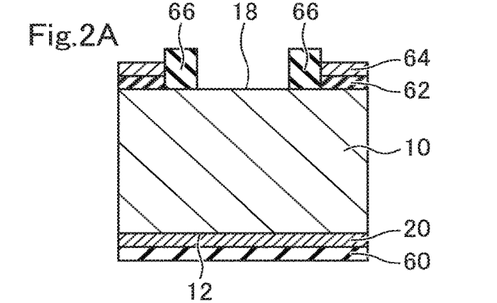
FIGS. 2A to 2H are schematic cross-sectional diagrams illustrating processes of manufacturing the semiconductor device according to the first embodiment.

First, an insulator 66, an insulator 62, and a metal film 64 provided on the insulator 62 are formed on a surface 18 of the substrate 10 provided on the opposite side of the substrate surface 12. The insulator 66 includes, for example, a polyimide resin, but is not limited to the polyimide resin. The insulator 62 and the metal film 64 are, for example, an interlayer insulating film and a source electrode of the MOSFET, but are not limited to the interlayer insulating film and the source electrode of the MOSFET. The surface 18 provided on the opposite side of the substrate surface 12 is exposed between the insulators 66, and the exposed portion is diced. Next, the electrode 20 containing a metal material is formed on the substrate surface 12 of the substrate 10 containing a semiconductor material, by, for example, a physical vapor deposition (PVD) method. The electrode 20 is fixed by a known dicing tape 60 (FIG. 2A).

Figure 2B:
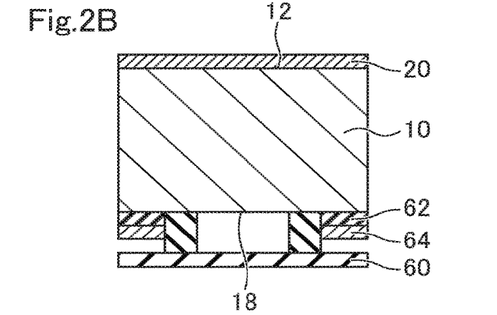

Next, the substrate 10 are turned upside down, and the side of the surface 18 provided on the opposite side of the substrate surface 12 is fixed with the dicing tape 60 (FIG. 2B).

Figure 2C:
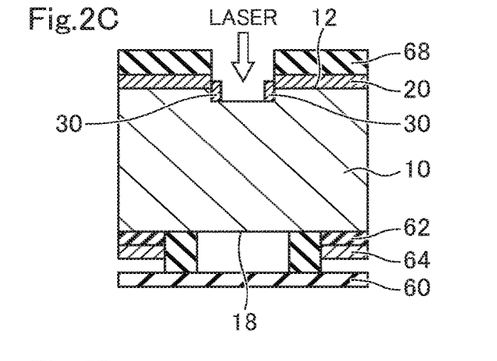
Figure 2D:
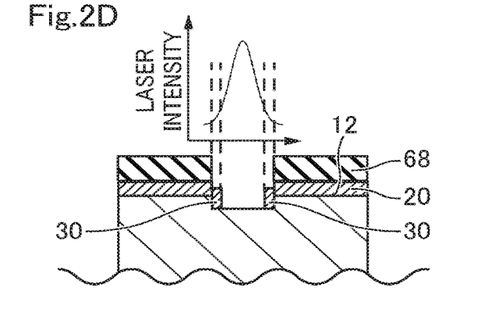

Next, a protective film 68 is formed on the electrode 20. The protective film 68 is used to protect the electrode 20 from the laser irradiation described later. Herein, the protective film 68 is, for example, a protective film containing a water-soluble resin. The water-soluble resin is, for example, polyvinyl alcohol, polyethylene glycol, or polyglycerin, but is not limited to polyvinyl alcohol, polyethylene glycol, or polyglycerin. Next, the protective film 68 is irradiated with laser from above the protective film 68 to perform laser grooving. The protective film 68 and the electrode 20 in the portion irradiated with the laser are lost, and a portion of the substrate 10 is exposed. Then, the mixed member 30 containing the semiconductor material contained in the substrate 10 and the metal material contained in the electrode 20 is formed around the portion where the substrate 10 and the electrode 20 are in contact with each other, at the end of the portion where a portion of the substrate 10 is exposed. In addition, the widths of the protective film 68 and the electrode 20 that have been lost are, for example, 100 μm or less. In addition, the depth of the portion of the substrate 10 that has been lost is, for example, less than 5 μm (FIG. 2C). As illustrated in FIG. 2D, the intensity of the laser described with reference to FIG. 2C has a distribution such that the laser intensity is high at the central portion of the laser and low at the edge portion of the laser in the direction parallel to the substrate surface 12. Then, the protective film 68 and the electrode 20 are lost at the central portion, and thus, a portion of the substrate 10 is exposed. On the other hand, at the above-described end, a portion of the electrode 20 remains without being lost, and the mixed member 30 is formed.

Figure 2E:
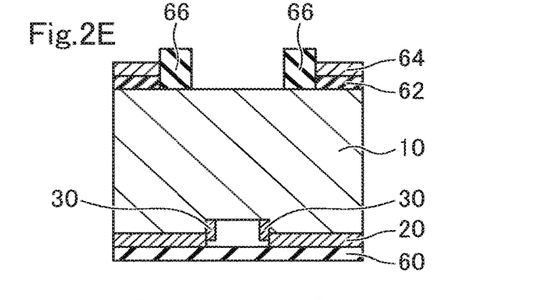

Next, the protective film 68 is removed by, for example, washing with water. Next, the substrate 10 is turned upside down, and the electrode 20 is fixed with the dicing tape 60 (FIG. 2E).

Figure 2F:
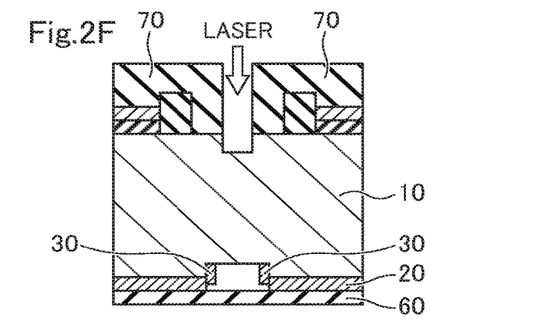

Next, a protective film 70 is applied on the metal film 64 and the insulator 66. Herein, the protective film 70 may be, for example, the same type of protective film as the protective film 68, but is not limited to the same type of protective film as the protective film 68. Next, the protective film 70 is irradiated with laser from above the protective film 70. A portion of the protective film 70 and a portion of the substrate 10 irradiated with the laser are lost. Herein, the lost depth of the substrate 10 is, for example, less than 10 μm. In addition, the width of the substrate 10 that has been lost is, for example, less than 100 μm (FIG. 2F).

Figure 2G:
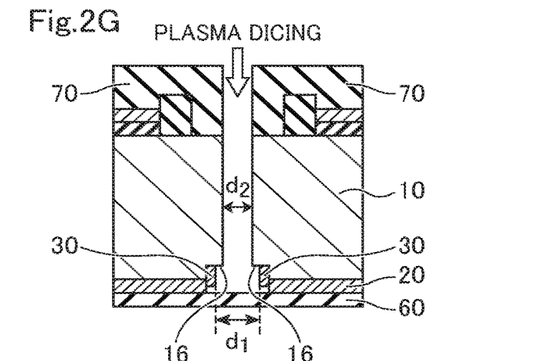
Figure 2H:
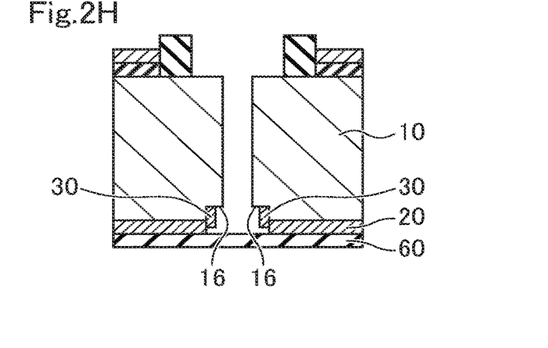

Next, the dicing of the above-described portions where the protective film 70 and the substrate 10 are partially lost by being irradiated with the laser is performed, for example, by using a plasma dicing method. Herein, a width $d_2$ of the portion of the substrate 10 that is cut by the plasma dicing method is set to be smaller than a distance $d_1$ between the mixed members 30. Accordingly, the removal of the mixed member 30 is suppressed after the plasma dicing is performed. In addition, accordingly, the exposed portion 16 of the substrate surface is formed in the portion adjacent to the mixed member 30 (FIG. 2G).

Next, the protective film 70 is removed by, for example, washing with water (FIG. 2H), and the substrate 10 is peeled off from the dicing tape 60 to obtain the semiconductor device 100 according to this embodiment.

Figure 3A:
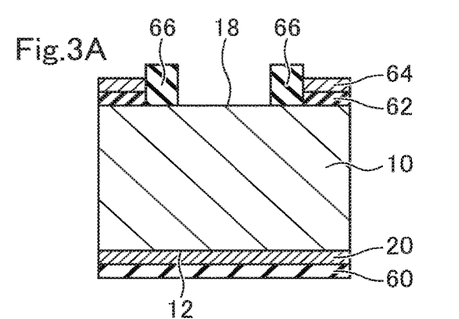
FIGS. 3A to 3E are schematic cross-sectional diagrams illustrating other processes of manufacturing the semiconductor device according to the first embodiment.
Figure 3B:
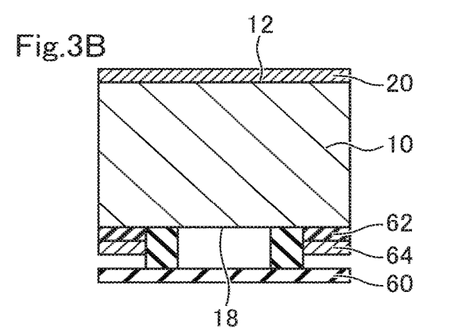
Figure 3C:
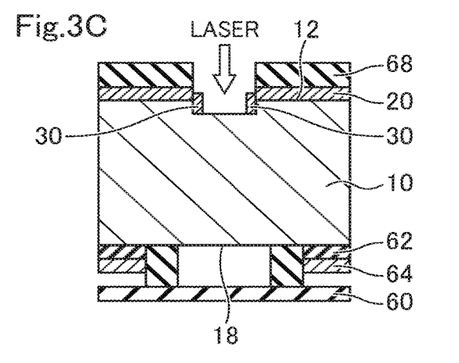
Figure 3D:
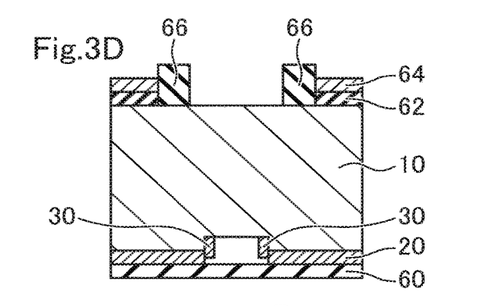
Figure 3E:
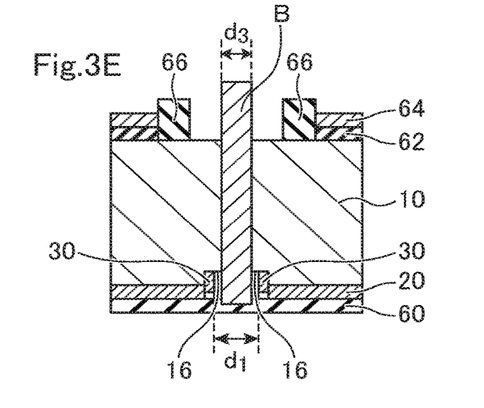

FIGS. 3A to 3E are schematic cross-sectional diagrams illustrating other processes of manufacturing the semiconductor device according to this embodiment. FIGS. 3A to 3D are the same as FIGS. 2A to 2D. The manufacturing process in FIG. 3E is different from the manufacturing processes illustrated in FIGS. 2A to 2H in that blade dicing is performed by using blade B in FIG. 3E. In addition, a width $d_3$ of the blade is allowed to be smaller than the distance $d_1$ between the mixed members 30. Accordingly, the removal of the mixed member 30 is suppressed after the blade dicing is performed. In addition, accordingly, the exposed portion 16 of the substrate surface is formed in the portion adjacent to the mixed member 30.

Next, the functions and effects of the semiconductor device according to this embodiment will be described.

In the related art, at the time of forming the electrode 20 on the substrate surface 12, the substrate surface 12 has been processed by, for example, wet etching. However, the adhesion property between the electrode 20 and the substrate surface 12 is poor, and there has been a problem in that the electrode 20 is peeled off from the substrate surface 12. This peeling has occurred particularly from the outer peripheral portion of the electrode 20. In order to solve this problem, it is considered that the adhesion property between the electrode 20 and the substrate surface 12 is provided by grinding the substrate surface 12 to make unevenness. However, in the grinding, a portion of the substrate 10 is crushed and a crushed layer is formed. In this case, since the crushed layer is formed on the substrate 10, there has been a problem in that the semiconductor device 100 is weak in strength and the semiconductor device 100 is easily broken in the subsequent processes.

The semiconductor device 100 according to this embodiment includes the mixed member 30 containing a semiconductor material and a metal material, which is provided on the substrate surface 12 so as to be in contact with the electrode 20, and a portion of the substrate surface 12 is exposed at an end of the substrate.

The mixed member 30 improves the adhesion property between the substrate surface 12 and the electrode 20. Therefore, it is possible to provide a highly reliable semiconductor device.

In addition, in both the process illustrated in FIG. 2F and the process illustrated in FIG. 3E, the removal of the electrode 20 and the mixed member 30 by plasma dicing and blade dicing is suppressed. In other words, the electrode 20 and the mixed member 30 are less likely to be cut by the plasma dicing and the blade dicing. For this reason, peeling of the electrode 20 caused by the plasma dicing and the blade dicing is less likely to occur. Therefore, it is possible to provide a highly reliable semiconductor device.

In addition, by the above-described laser processing, the end of the upper surface of the electrode 20 has the chamfered portion 24. In addition, by the above-described laser processing, the mixed member 30 has a triangular shape having a side 32 in contact with the side surface of the electrode and a side 34 in contact with the substrate surface 12 in a plane perpendicular to the substrate surface 12.

According to the semiconductor device according to this embodiment, it is possible to provide a highly reliable semiconductor device.

Second Embodiment

A semiconductor device according to this embodiment includes: a substrate containing a semiconductor material; an electrode provided on a substrate surface of the substrate, the electrode containing a metal material; and a mixed member provided on the substrate surface to be in contact with the electrode, the mixed member containing the semiconductor material and the metal material, in which an end of an upper surface of the electrode has a chamfered portion, and in which the mixed member has a triangular shape having a side in contact with a side surface of the electrode and a side in contact with the substrate surface in a plane perpendicular to the substrate surface. Herein, the description of the contents overlapping with those of the first embodiment is omitted.

Figure 4:
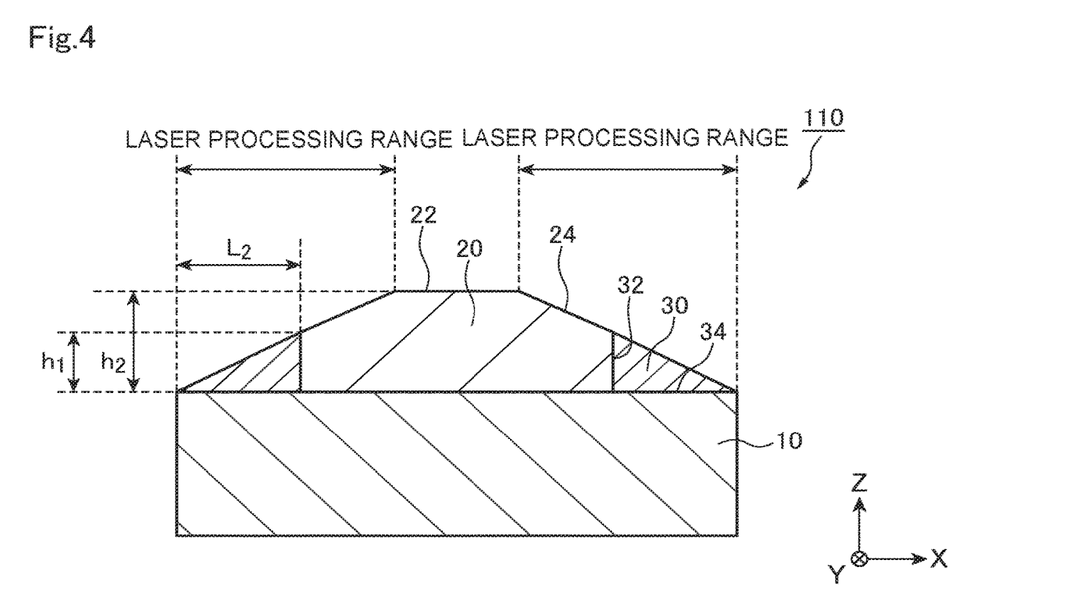
FIG. 4 is a schematic cross-sectional diagram of a semiconductor device according to a second embodiment.

FIG. 4 is a schematic cross-sectional diagram of a semiconductor device 110 according to this embodiment. The semiconductor device 110 according to this embodiment is different from the semiconductor device according to the first embodiment in that a portion of the substrate surface 12 is not exposed at the end of the substrate 10. The semiconductor device 110 according to this embodiment corresponds to, for example, the case of $d_1 = d_2$ in the above-described manufacturing process illustrated in FIG. 2G. In addition, the semiconductor device 110 according to this embodiment corresponds to, for example, the case of $d_1 = d_3$ in the above-described manufacturing process illustrated in FIG. 3E. Also in these cases, peeling of the electrode 20 due to the plasma dicing and the blade dicing is suppressed.

According to the semiconductor device of this embodiment, it is also possible to provide a highly reliable semiconductor device.

Third Embodiment

A semiconductor device according to this embodiment is different from those of the first and second embodiments in that the electrode has a rectangular shape in a plane perpendicular to the substrate surface, the mixed member has a rectangular shape in the plane perpendicular to the substrate surface, the height of the mixed member is smaller than the height of the electrode, and the length of the electrode parallel to the substrate surface is larger than the length of the mixed member parallel to the substrate surface. Herein, description of contents overlapping with those of the first and second embodiments is omitted.

Figure 5:
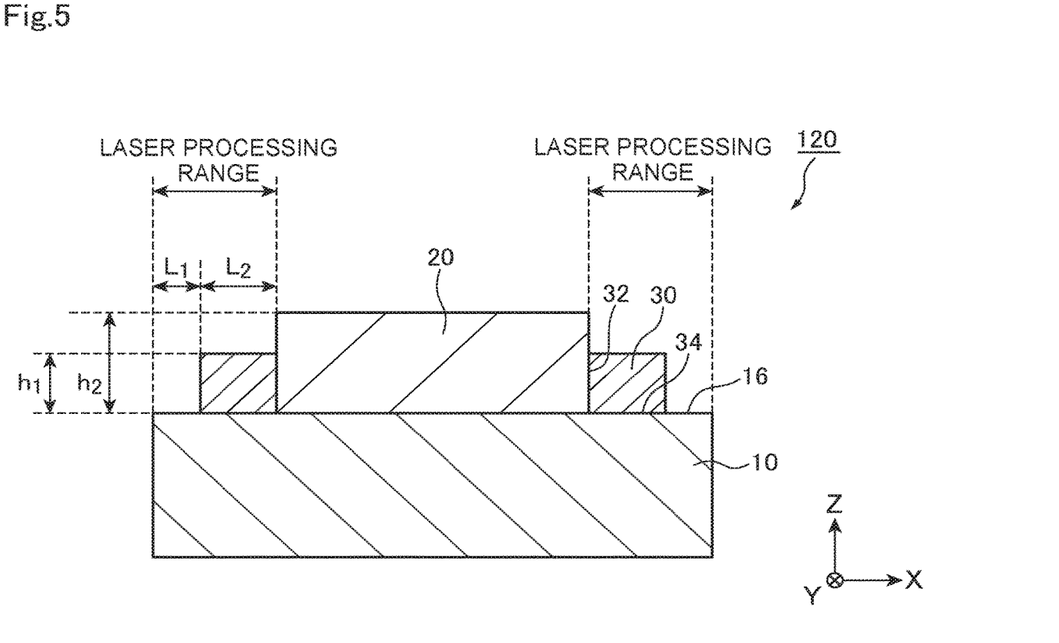
FIG. 5 is a schematic cross-sectional diagram of a semiconductor device according to a third embodiment.

FIG. 5 is a schematic cross-sectional diagram of a semiconductor device 120 according to this embodiment.

According to the semiconductor device of this embodiment, it is also possible to provide a highly reliable semiconductor device.

Fourth Embodiment

A semiconductor device according to this embodiment is different from the semiconductor devices according to the first to third embodiments in that the electrode and the mixed member have a step shape provided on the upper surface of the mixed member or the upper surface of the electrode. Herein, the description of contents overlapping with those of the first to third embodiments will be omitted.

Figure 6:
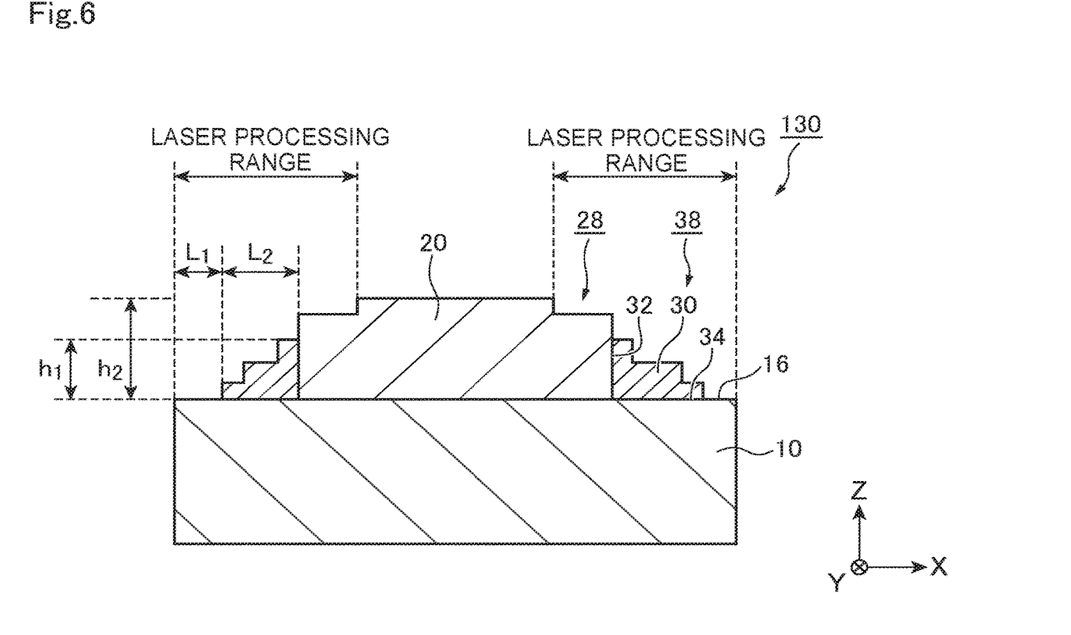
FIG. 6 is a schematic cross-sectional diagram of a semiconductor device according to a fourth embodiment.

FIG. 6 is a schematic cross-sectional diagram of a semiconductor device 130 according to this embodiment.

A first step shape 38 is provided on the upper surface of the mixed member 30. A second step shape 28 is provided on the upper surface of the electrode 20. The first step shape 38 and the second step shape 28 are examples of step shapes. The first step shape 38 and the second step shape 28 are formed by the above-described laser processing.

For example, each of the first step shape 38 and the second step shape 28 may be a step shape that is continuous from the exposed portion 16 of the substrate surface to the upper surface of the electrode 20.

According to the semiconductor device of this embodiment, it is also possible to provide a highly reliable semiconductor device.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:

preparing a substrate containing a semiconductor material and having a first surface and a second surface, the substrate being provided with an electrode containing a metal material on the first surface and a first protective film on the electrode;

forming a first groove extending on the substrate in a first direction by performing first irradiation with a first laser on the first protective film to lose a portion of the first protective film, a portion of the electrode, and a portion of the substrate on a side of the first surface, mixed members being formed at both ends of the first groove in a second direction perpendicular to the first direction and in contact with the electrode and the substrate, the mixed members containing the metal material and the semiconductor material;

removing the first protective film; and dicing the substrate in the first groove to cut the substrate.

2. The method for manufacturing a semiconductor device according to claim 1, further comprising:

forming a second protective film on the second surface; and forming a second groove extending on the substrate in the first direction by performing second irradiation with a second laser on the second protective film to lose a portion of the second protective film and a portion of the substrate on a side of the second surface.

3. The method for manufacturing a semiconductor device according to claim 2, wherein the substrate has a portion with the first groove and the second groove overlapping in a third direction perpendicular to the first direction and the second direction, and in the dicing, the portion is diced.

4. The method for manufacturing a semiconductor device according to claim 1, wherein, in the dicing, the substrate is diced from the second surface toward the first surface.

5. The method for manufacturing a semiconductor device according to claim 1, wherein a width of the portion cut by the dicing of the substrate in the dicing is smaller than an interval between the mixed members formed at both ends in the second direction.

\* \* \* \* \*